(12) United States Patent
Fang et al.

(10) Patent No.: US 10,967,756 B2
(45) Date of Patent: Apr. 6, 2021

(54) LIQUID COOLING MODULE

(71) Applicant: National Chung-Shan Institute of Science and Technology, Taoyuan (TW)

(72) Inventors: Fu-Min Fang, Taoyuan (TW); Kuo-Kuang Jen, Taoyuan (TW); Gwo-Huei You, Taoyuan (TW)

(73) Assignee: National Chung-Shan Institute of Science and Technology, Taoyuan (TW)

(*) Notice: Subject to any disclaimer, the term of this patent is extended or adjusted under 35 U.S.C. 154(b) by 139 days.

(21) Appl. No.: 16/226,665

(22) Filed: Dec. 20, 2018

(65) Prior Publication Data

US 2020/0198496 A1 Jun. 25, 2020

(51) Int. Cl.
*H05K 7/20* (2006.01)
*B60L 58/26* (2019.01)
*H01M 10/613* (2014.01)
*H01M 10/6568* (2014.01)
*H01L 23/473* (2006.01)

(52) U.S. Cl.
CPC ............ *B60L 58/26* (2019.02); *H01L 23/473* (2013.01); *H01M 10/613* (2015.04); *H01M 10/6568* (2015.04); *H05K 7/20254* (2013.01); *H05K 7/20263* (2013.01); *H05K 7/20272* (2013.01); *B60L 2270/46* (2013.01)

(58) Field of Classification Search
CPC .. H01L 23/473; F28F 2250/08; F04B 43/043; F04B 43/046; H01M 10/613; H01M 10/6556; H01M 10/6568; H05K 7/20254; H05K 7/20272; H05K 7/20263
See application file for complete search history.

(56) References Cited

U.S. PATENT DOCUMENTS

| 6,203,291 | B1 * | 3/2001 | Stemme | ................ | F04B 43/043 |
|---|---|---|---|---|---|
| | | | | | 137/833 |
| 2013/0209856 | A1 * | 8/2013 | Lev | ...................... | H01M 10/625 |
| | | | | | 429/120 |
| 2015/0318587 | A1 * | 11/2015 | Kim | ..................... | H01M 10/441 |
| | | | | | 320/112 |
| 2016/0211558 | A1 * | 7/2016 | Ma | ....................... | H01M 10/625 |
| 2017/0235350 | A1 * | 8/2017 | Tsai | ...................... | H01L 23/473 |
| | | | | | 165/80.4 |

FOREIGN PATENT DOCUMENTS

DE 10232692 A1 * 2/2004 ......... H05K 7/20263

* cited by examiner

*Primary Examiner* — Eric S Ruppert
(74) *Attorney, Agent, or Firm* — Winston Hsu

(57) ABSTRACT

A liquid cooling module comprises a cooling plate, including a plurality of cooling channels for liquid flowing, and a pump block, integrated with the cooling plate and including a pump and a heat exchange chamber connecting to the plurality of cooling channels of the cooling plate, to form a circulation loop.

7 Claims, 7 Drawing Sheets

LIQUID COOLING MODULE

BACKGROUND OF THE INVENTION

1. Field of the Invention

The present invention relates to a liquid cooling system, and more particularly, to a liquid cooling module with independent liquid cooling circulation loop.

2. Description of the Prior Art

In electric vehicle batteries, fast charging or high load electron flow generates a large amount of heat, and excessive heat may damage the battery. In order to increase efficiency of the electric vehicle battery and maximize battery life, cooling system is required. According to different cooling designs, it can be classified into an air-cooled type, or a liquid cooling type, where liquid glycol is used as a coolant.

For liquid cooling type, the heat of the batteries is transferred to a liquid cooling circulation loop. That is, the glycol coolant is distributed throughout the battery pack to cool the battery cell, which may be realized by a strip-shaped metal cooling tube that runs through the entire battery pack and directly contacts the wall of the cylindrical core to remove heat, or by cooling plates placed between the battery cells, where separate coolant paths in the cooling plate that pass in parallel through the cooling plates, each of which is housed in a plastic frame, and then the frames with the cooling plates are stacked longitudinally to form the battery pack.

However, the applicant notices that there are some problems in the abovementioned cooling system. For example, the strip-shaped metal cooling tube is designed for a single large battery pack. In other words, it cannot be applied to the modularized battery module, which results in maintenance difficulties. Cooling plates placed between the battery cells for dissipating heat are required of pipelines for connection, so as to form a complete liquid cooling circulation loop. However, if a single battery cell is needed to be repaired, liquid coolant leakage problem may be occurs because of unwiring the pipelines for maintenance. In addition, the pipeline wiring is complicated and thus increasing difficulties of maintenance. Besides, liquid cooling circulation loop requires an external pump or a heat exchanger for heat dissipation, which takes up extra space in vehicle.

SUMMARY OF THE INVENTION

It is therefore an objective to provide a liquid cooling module to solve the above problem.

The present invention discloses a liquid cooling module. The liquid cooling module comprises a cooling plate, including a plurality of cooling channels for liquid flowing, and a pump block, integrated with the cooling plate and including a pump and a heat exchange chamber connecting to the plurality of cooling channels of the cooling plate, to form a circulation loop.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
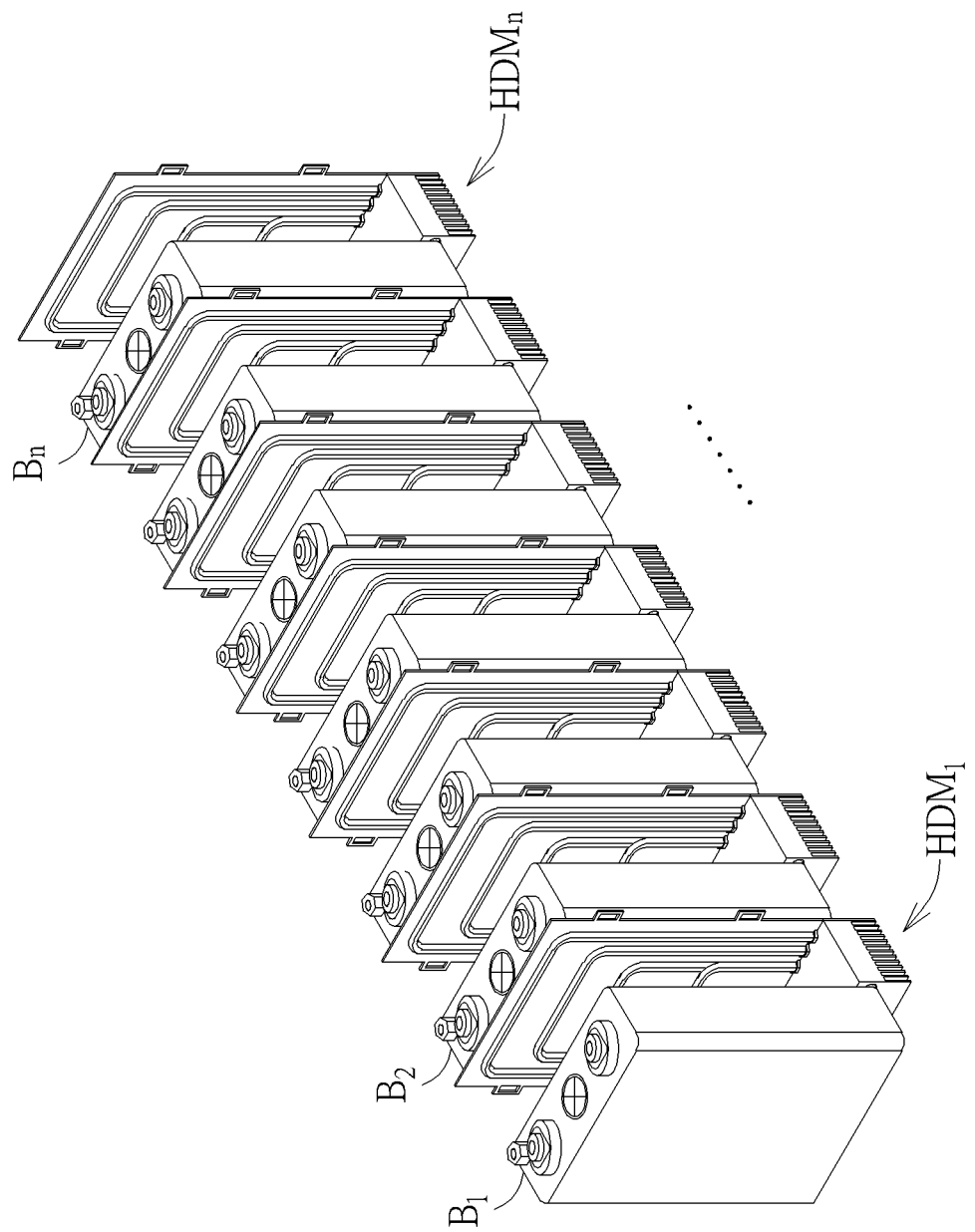
FIG. 1 is a schematic diagram of a battery system according to an embodiment of the present disclosure.
Figure 2:
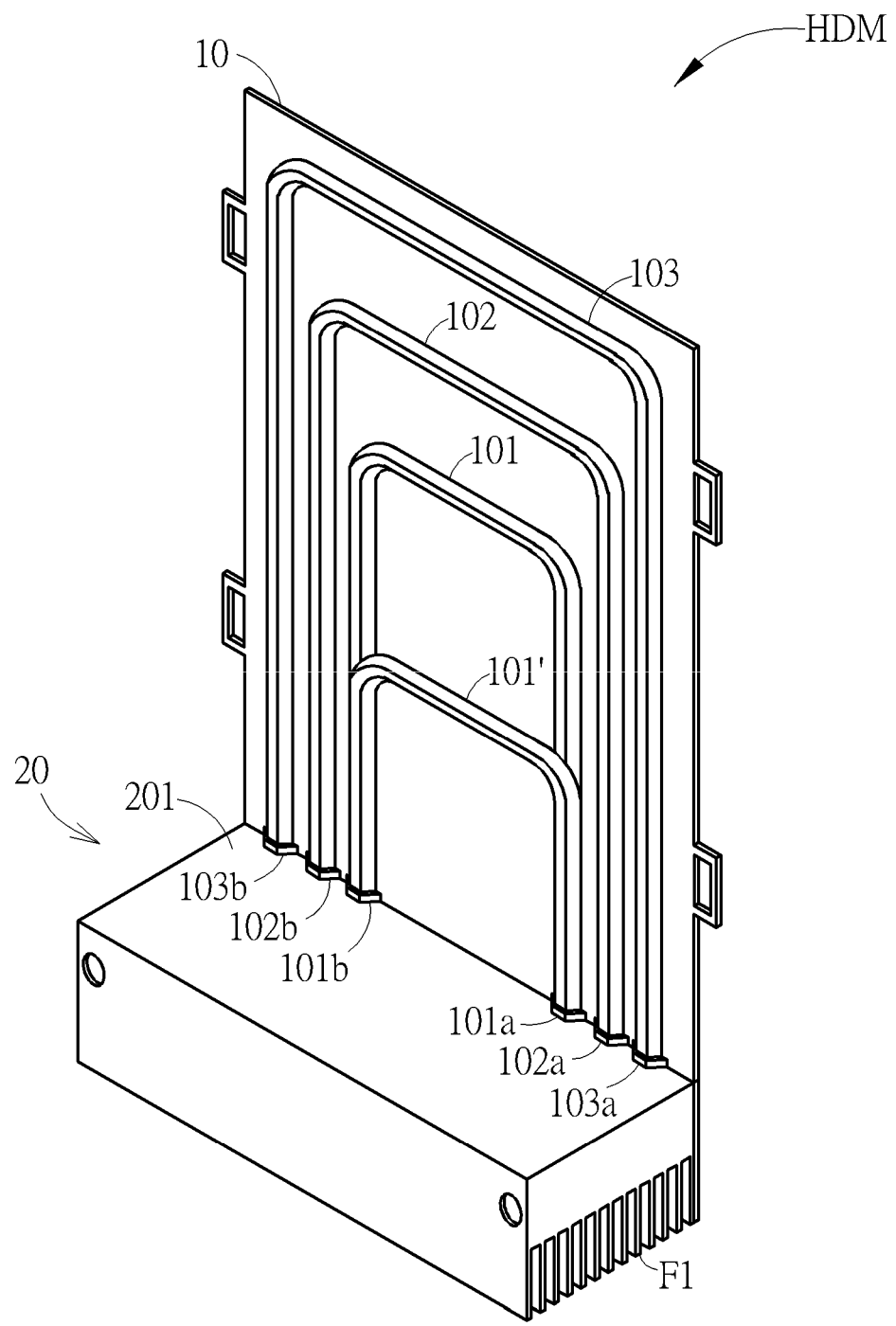
FIG. 2 is a schematic diagram of a liquid cooling module according to an embodiment of the present disclosure.

FIG. 1 is a schematic diagram of a battery system according to an embodiment of the present disclosure. The battery system includes batteries $B_1$-$B_n$ and each battery has its liquid cooling module HDM. The liquid cooling modules $HDM_1$-$HDM_n$ are arranged in an alternating relationship between the batteries $B_1$-$B_n$. Reference is made to FIG. 2, which is a schematic diagram of the liquid cooling module HDM according to an embodiment of the present disclosure. The liquid cooling module HDM includes the cooling plate 10 and the pump block 20 integrated with the cooling plate 10. The integration method could be any connecting or embedding structure, which is not limited herein. The pump block 20 includes a heat sink 201 (i.e. made of copper or aluminum) for carrying the battery and fast heat dissipating. In addition, the pump block 20 may include fins for heat dissipation.

Figure 3:
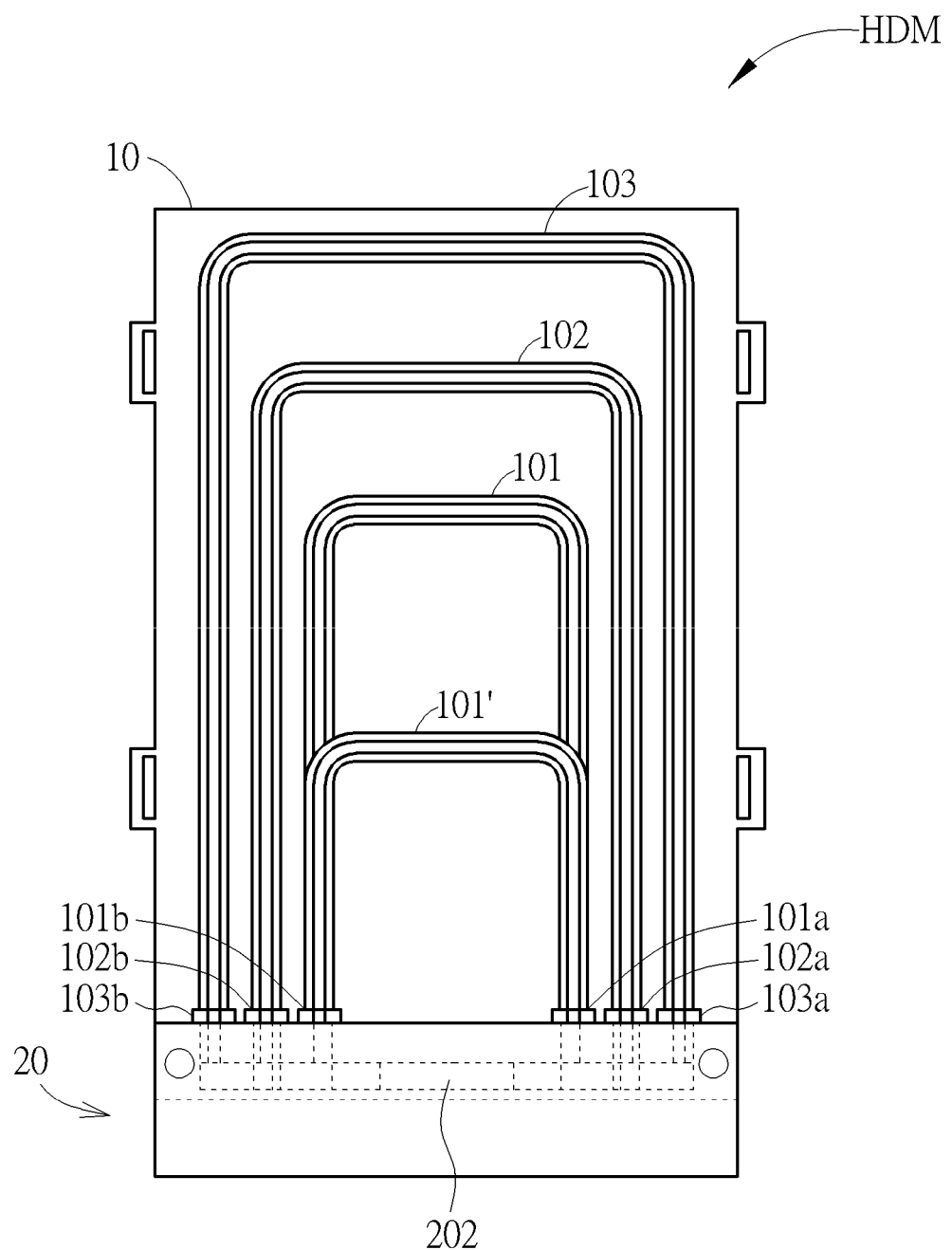
FIG. 3 is a schematic diagram of a cooling plate of the liquid cooling module according to an embodiment of the present disclosure.

Reference is made to FIG. 3, which illustrates the cooling plate 10 of the liquid cooling module HDM according to an embodiment of the present disclosure. In FIG. 3, the cooling plate 10 includes a plurality of cooling channels 101' and 101-103 for liquid flowing, so as to remove the heat from the battery. The cooling channels 101' and 101-103 includes flow paths in a U-shape and are arranged around to each other, so that the flow paths are deployed in different regions for fast heat dissipation. In addition, the cooling channels 101' and 101-103 include the inlet port 101a-103a and the outlet port 101b-103b, to connect with the pump block 20.

Figure 4:
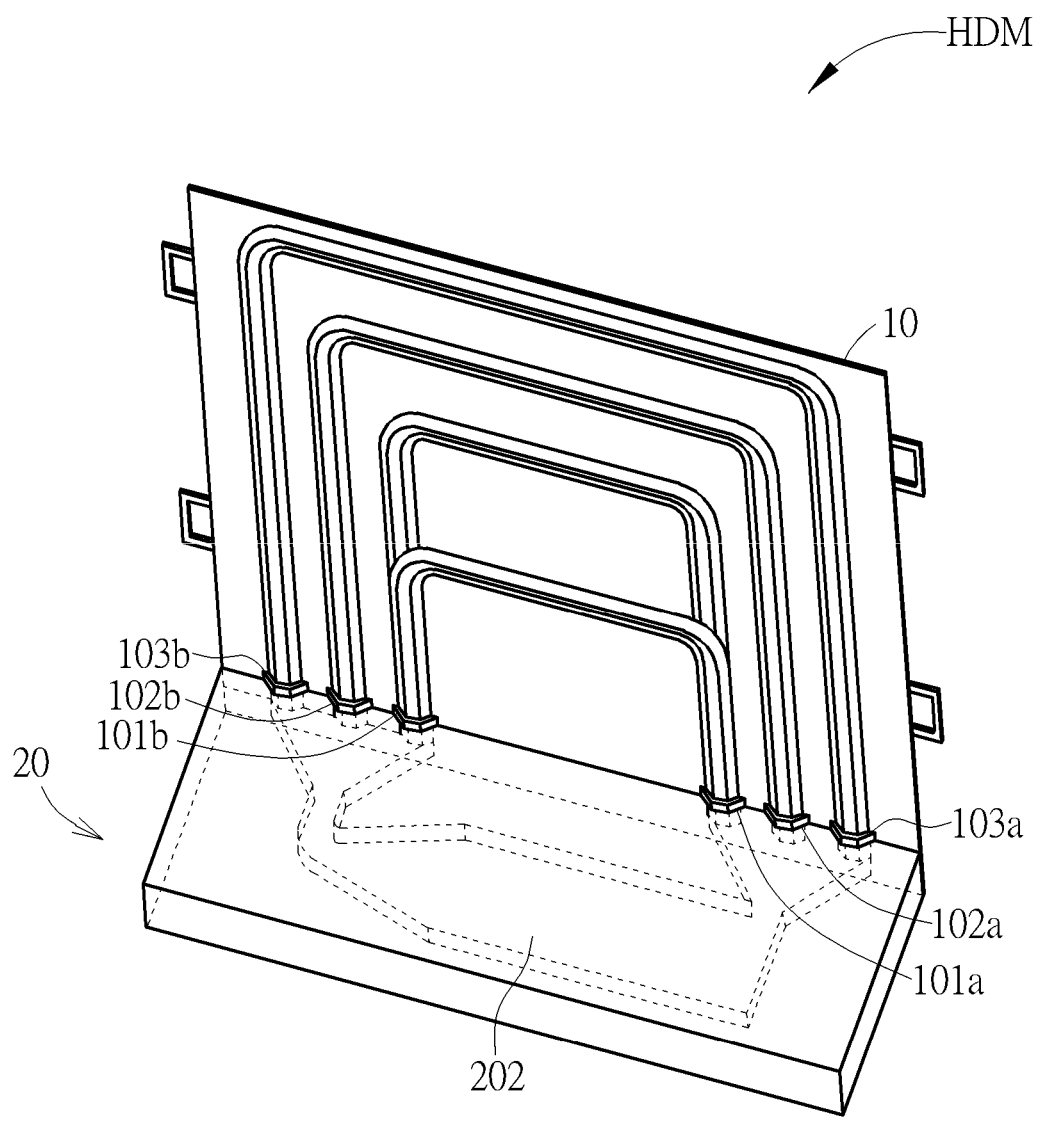
FIG. 4 is a schematic diagram of a pump block of the liquid cooling module according to an embodiment of the present disclosure.
Figure 5:
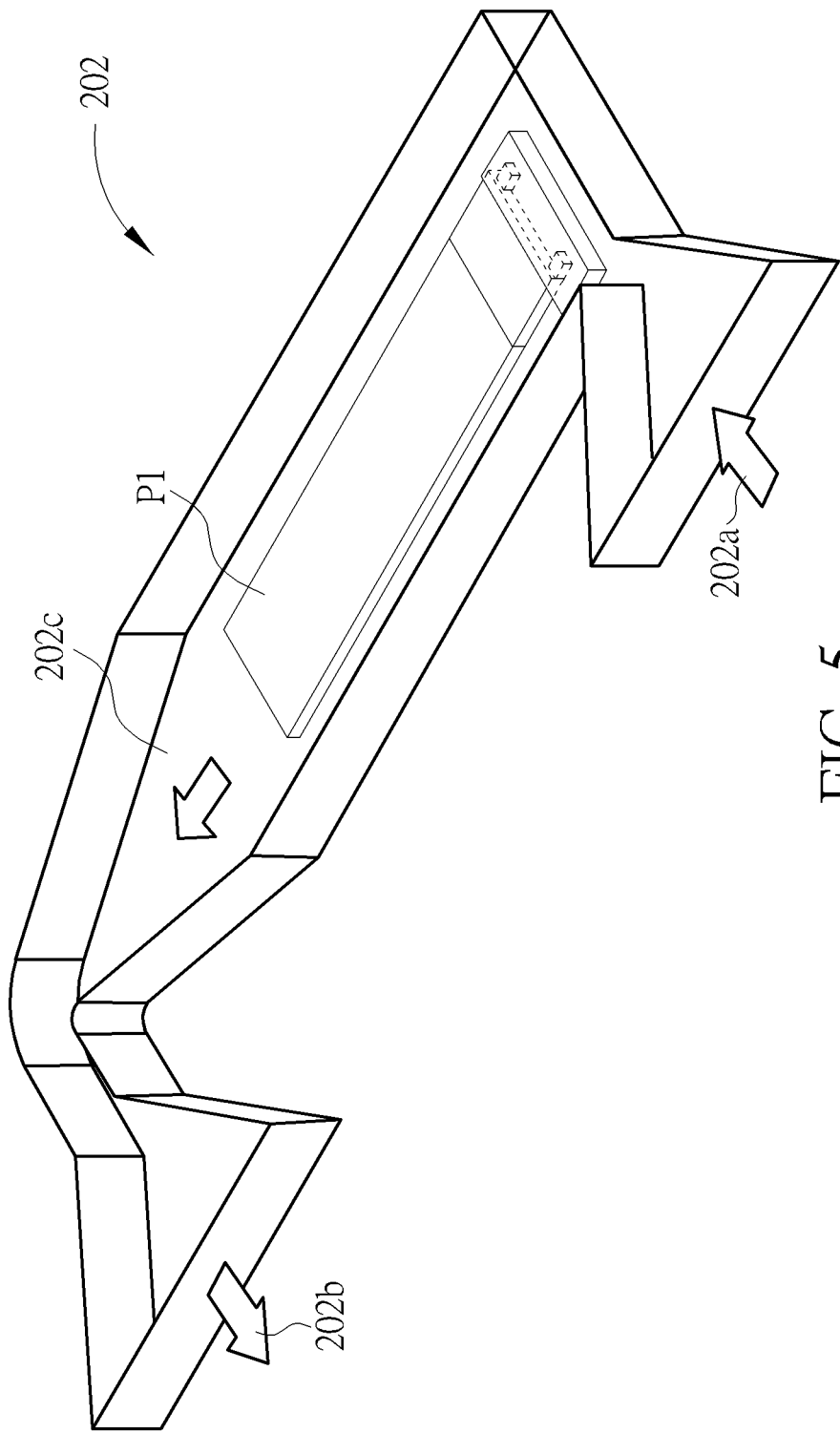
FIG. 5 is a schematic diagram of a heat exchange chamber of a pump block according to an embodiment of the present disclosure.

FIGS. 4-5 illustrate the pump block 20 of the liquid cooling module HMD according to an embodiment of the present disclosure. The pump block 20 includes the heat exchange chamber 202, wherein the heat exchange chamber 202 consists of the converging nozzle (inlet) 202a, the diverging nozzle (outlet) 202b, and the flow channel 202c. As shown in FIG. 4, the inlet port 101a-103a and the outlet port 101b-103b of the cooling channel 101' and 101-103 are connected to the converging nozzle 202a and the diverging nozzle 202b respectively. In detail, the wide expansion part of the converging/diverging nozzle 202a-202b is used for collecting fluid from the inlet/output ports 101a-103a and 101b-103b, and a narrow part of the converging/diverging nozzle 202a-202b is used for fluid converging, as shown in FIG. 5.

Figure 6:
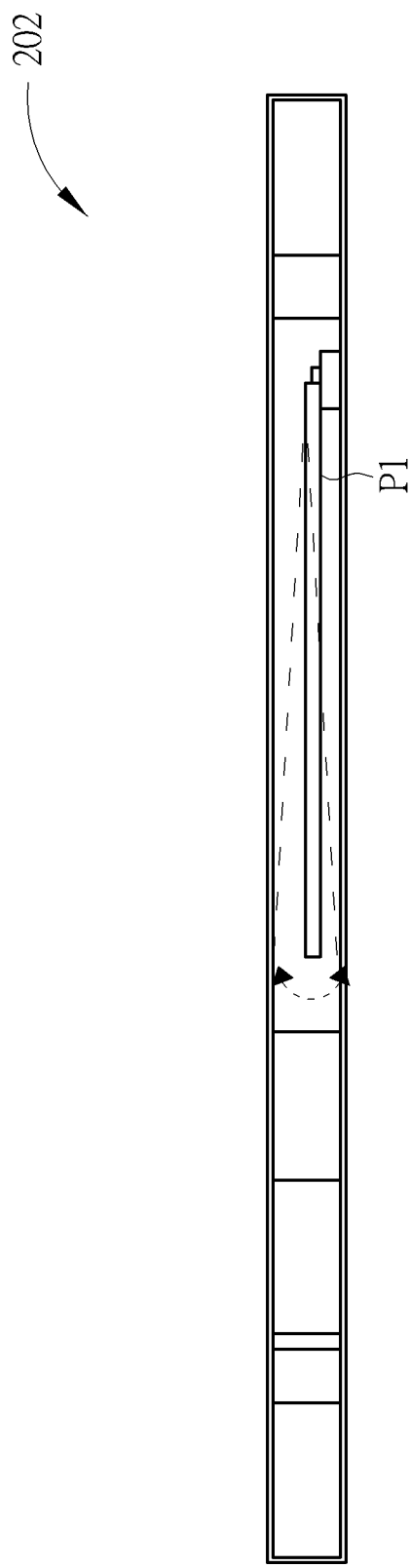
FIG. 6 is a side view of a heat exchange chamber according to FIG. 5.

Reference is made to FIG. 6, which is a side view of the heat exchange chamber 202 according to FIG. 5. As shown in FIG. 6, the pump P1 is arranged at the heat exchange chamber 202 for moving the liquid in the cooling channel 101' and 101-103 at faster speeds, into heat exchange chamber 202 via pulsation movement. Thus, the self-liquid cooling circulation loop is formed in the liquid cooling module HDM. In a word, the liquid cooling module HDM is worked as an independent circulating heat-dissipating unit.

In an embodiment, the pump P1 is a miniature pump, and is complied with fluid dynamics principle, to realize liquid circulation for heat dissipation. For example, the piezoelectric pump in the heat exchange chamber 202 is powered by a single battery, wherein the battery is placed on the pump block 20, so as to save installation space.

Figure 7:
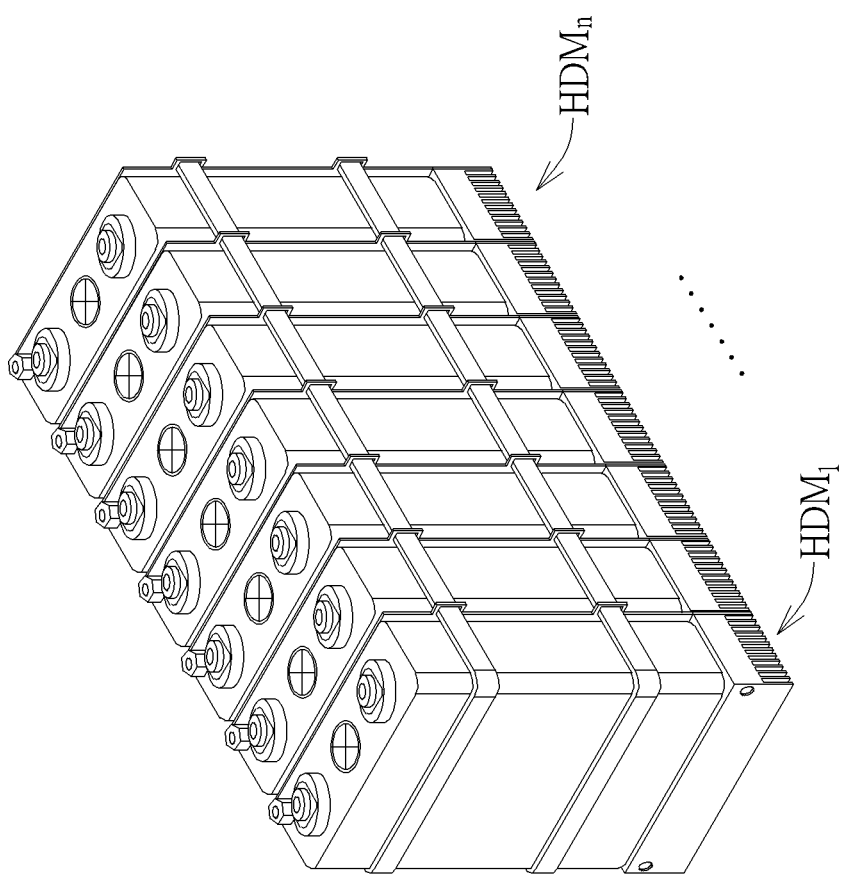
FIG. 7 is a schematic diagram of a battery system in stack according to an embodiment of the present disclosure.

Reference is made to FIG. 7, which is a schematic diagram of a battery system in stack according to an embodiment of the present disclosure. Each battery is set in the heat sink 201 of the pump block 20 and adjacent to the cooling plate 10. As abovementioned, by liquid flow channels configured to the pump block 20 and the cooling plate 10, namely self-liquid cooling circulation loop of the liquid cooling module HDM, the heat from the battery system is dissipating accordingly.

Note that, with the liquid cooling module HMD, it is convenient to repair a single battery of the battery system since there is no need of considering piping, water block, pump, heat exchanger deployment, etc., and thus extra space for water block installation, leakage problem or complex pipeline wiring is solved. That is, since every batteries is equipped with an independent circulating heat-dissipating unit (i.e. the liquid cooling module HMD), problems in the conventional liquid cooling system has be solved.

In conclusion, the present invention addresses the liquid cooling module an electric vehicle requiring high power output or a fast-charging in-vehicle battery system. In detail, the liquid cooling module includes a pump block integrated with the cooling plate to form a self-liquid cooling circulation loop. With the integrated design the space occupied by these components, such as water block, pipeline, etc., is reduced and battery maintenance is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A liquid cooling module comprising:
a cooling plate, including a plurality of cooling channels having at least two different outlet ports and at least two different inlet ports for liquid flowing into the cooling plate and flowing out the cooling plate; and
a pump block, integrated with the cooling plate and including a pump and a heat exchange chamber connecting to the plurality of cooling channels of the cooling plate, to form a circulation loop;
wherein the heat exchange chamber includes a flow channel, a converging nozzle and a diverging nozzle;
wherein each cooling channel includes an inlet port and an outlet port connecting to the converging nozzle and the diverging nozzle respectively;
wherein a wide expansion part of the converging nozzle and a wide expansion part of the diverging nozzle are used for collecting fluid for the inlet port and the output port, and a narrow part of the converging nozzle and a narrow part of diverging nozzle are used for fluid converging;
wherein the wide expansion part of the converging nozzle is closer to the inlet port than the narrow part of the converging nozzle such that the converging nozzle is widest on a first side near the inlet port and narrowest on a second side near the flow channel, and the wide expansion part of the diverging nozzle is closer to the outlet port than the narrow part of the diverging nozzle such that the diverging nozzle is widest on a third side near the outlet port and narrowest on a fourth side near the flow channel.

2. The liquid cooling module of claim 1, wherein the pump is arranged at the heat exchange chamber.

3. The liquid cooling module of claim 1, wherein the pump block includes a heat sink for carrying a battery.

4. The liquid cooling module of claim 3, wherein the pump is powered by the battery.

5. The liquid cooling module of claim 1, wherein the pump block includes fins for heat dissipating.

6. The liquid cooling module of claim 1, wherein the plurality of cooling channels include a plurality of flow paths in U-shape and at least first one of the plurality of cooling channels is arranged around at least second one of the plurality of cooling channels.

7. The liquid cooling module of claim 1, wherein the pump is a miniature pump or a piezoelectric pump.

* * * * *